United States Patent
Tsuda et al.

(10) Patent No.: US 6,924,512 B2
(45) Date of Patent: Aug. 2, 2005

(54) NITRIDE SEMICONDUCTOR LIGHT-EMITTING DEVICE AND OPTICAL APPARATUS INCLUDING THE SAME

(75) Inventors: Yuhzoh Tsuda, Tenri (JP); Takayuki Yuasa, Ikoma-gun (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/276,512

(22) PCT Filed: May 7, 2001

(86) PCT No.: PCT/JP01/03825
§ 371 (c)(1),
(2), (4) Date: Nov. 14, 2002

(87) PCT Pub. No.: WO01/93388
PCT Pub. Date: Dec. 6, 2001

(65) Prior Publication Data
US 2003/0136957 A1 Jul. 24, 2003

(30) Foreign Application Priority Data
May 29, 2000 (JP) ........................................ 2000-158189

(51) Int. Cl.[7] ................................................. H01L 33/00
(52) U.S. Cl. ............................ 257/97; 257/13; 257/103; 372/45; 372/50
(58) Field of Search ............................ 257/13, 97, 103; 372/45, 50

(56) References Cited

U.S. PATENT DOCUMENTS

| | | | |
|---|---|---|---|
| 5,994,158 A | * | 11/1999 | Kashima et al. .............. 438/47 |
| 6,031,858 A | * | 2/2000 | Hatakoshi et al. ............ 372/46 |
| 6,472,680 B1 | * | 10/2002 | Takayama et al. ............ 257/14 |
| 6,542,526 B1 | * | 4/2003 | Niwa et al. .................... 372/45 |

FOREIGN PATENT DOCUMENTS

| | | |
|---|---|---|
| JP | 08-032113 | 2/1996 |
| JP | 08-316581 | 11/1996 |
| JP | 10-126005 | 5/1998 |
| JP | 10-145003 | 5/1998 |
| JP | 10-270804 | 10/1998 |
| JP | 10-335748 | 12/1998 |
| WO | WO 97/11518 | 3/1997 |

OTHER PUBLICATIONS

Nakamura et al. (1997). "InGaN/GaN/AlGaN–Based Laser Diodes with Modulation–Doped Strained–Layer Superlattices," Jpn. J. Appl. Phys. 36(12A):L1568–L1571.

* cited by examiner

*Primary Examiner*—Jerome Jackson
(74) *Attorney, Agent, or Firm*—Morrison & Foerster LLP

(57) ABSTRACT

A nitride semiconductor light emitting device includes an emission layer (106) having a multiple quantum well structure where a plurality of quantum well layers and a plurality of barrier layers are alternately stacked. The quantum well layer is formed of $XN_{1-x-y-z}As_xP_ySb_z$ ($0 \leq x \leq 0.15$, $0 \leq y \leq 0.2$, $0 \leq z \leq 0.05$, $x+y+z>0$) where X represents one or more kinds of group III elements. The barrier layer is formed of a nitride semiconductor layer containing at least Al.

16 Claims, 9 Drawing Sheets

NITRIDE SEMICONDUCTOR LIGHT-EMITTING DEVICE AND OPTICAL APPARATUS INCLUDING THE SAME

CROSS-REFERENCE TO RELATED APPLICATIONS

This application is a National Phase under 35 U.S.C. § 371 of International Application No. PCT/JP01/03825 filed on May 7, 2001 which claims priority to Japanese Patent Application No. 2000-158189 filed on May 29, 2000, the contents of each of which are incorporated herein by reference in their entirety.

TECHNICAL FIELD

The present invention relates to a nitride semiconductor light emitting device with high luminous efficiency and an optical apparatus using the same.

BACKGROUND ART

Conventionally, nitride semiconductor has been used or studied for a light emitting device or a high power semiconductor device. In the case of a nitride semiconductor light emitting device, a light emitting device in a wide color range from blue to orange can be fabricated. Recently, by utilizing the characteristics of the nitride semiconductor light emitting device, a blue or green light emitting diode or a bluish violet semiconductor laser has been developed. Japanese Patent Laying-Open No. 10-270804 has reported a light emitting device including an emission layer formed of GaNAs well layers/GaN barrier layers.

In the GaNAs/GaN emission layer described in Japanese Patent Laying-Open No. 10-270804, however, crystal phase separation of a hexagonal system having a high N concentration and a cubic system (zinc blende structure) having a low N concentration is liable to occur, and thus a light emitting device having a high luminous efficiency is hardly obtained.

DISCLOSURE OF THE INVENTION

A main object of the present invention is therefore to enhance the luminous efficiency in a nitride semiconductor light emitting device including an emission layer having a quantum well structure formed of nitride semiconductor by improving crystallinity of the emission layer and suppressing crystal phase separation.

According to the present invention, a nitride semiconductor light emitting device includes an emission layer having a multiple quantum well structure where a plurality of quantum well layers and a plurality of barrier layers are alternately stacked. The quantum well layer is formed of $XN_{1-x-y-z}As_xP_ySb_z$ ($0 \leq x \leq 0.15$, $0 \leq y \leq 0.2$, $0 \leq z \leq 0.05$. $x+y+z>0$), where X represents one or more kinds of group III elements. The barrier layer is formed of a nitride semiconductor containing at least Al.

In this way, the emission layer for causing effect of emitting light includes the quantum well layers and the barrier layers, and the quantum well layer has a smaller energy band gap as compared with the barrier layer.

It is preferable that the barrier layer further contains In. It is also preferable that the barrier layer further contains any element selected from the group consisting of As, P and Sb.

The nitride semiconductor light emitting device includes a substrate and the emission layer has a first main surface closer to the substrate and a second main surface farther from the substrate. In a first adjacent semiconductor layer in contact with the first main surface of the emission layer and a second adjacent semiconductor layer in contact with the second main surface of the emission layer, at least the second adjacent semiconductor layer is preferably formed of a nitride semiconductor containing at least Al. One of the quantum well layer is preferably in direct contact with the first adjacent semiconductor layer or the second adjacent semiconductor layer.

Al content in the barrier layer is preferably at least $5 \times 10^{18}/cm^3$. In group V elements in the barrier layer, preferably, As content is at most 7.5%, P content is at most 10% and Sb content is at most 2.5%.

The emission layer preferably includes at least two to at most ten well layers. The quantum well layer preferably has a thickness of at least 0.4 nm and at most 20 nm. The barrier layer preferably has a thickness of at least 1 nm and at most 20 nm.

At least one kind of dopant selected from the group consisting of Si, O, S, C, Ge, Zn, Cd and Mg is preferably added to the well layers and/or the barrier layers. The amount of such added dopant is preferably within a range of $1 \times 10^{16} – 1 \times 10^{20}/cm^3$.

GaN may preferably be used as a substrate material of the nitride semiconductor light emitting device.

The nitride semiconductor light emitting device described above may preferably be used in a variety of optical apparatuses such as an optical information reading apparatus, an optical information writing apparatus, an optical pickup, a laser printer, a projector, a display, a white light source apparatus and the like.

BEST MODES FOR CARRYING OUT THE INVENTION

Various embodiments of the present invention will be described in the following.

Generally, GaN, sapphire, 6H-SiC, 4H-SiC, 3C-SiC, Si, Spinel ($MgAl_2O_4$) or the like is used as a substrate material to grow a nitride semiconductor crystal layer. Similarly as a GaN substrate, another substrate made of nitride semiconductor can also be used. For example, $Al_xGa_yIn_zN$ ($0 \leq x \leq 1$, $0 \leq y \leq 1$, $0 \leq z \leq 1$, x+y+z=1) substrate can be used. In the case of a nitride semiconductor laser, in order to attain a unimodal vertical lateral mode, a layer having a refractive index lower than that of a cladding layer needs to be in contact with the outer side of the cladding layer, and an AlGaN substrate is preferably used. Furthermore, Si, O, Cl, S, C, Ge, Zn, Cd, Mg or Be may be doped in the substrate. For an n-type nitride semiconductor substrate, Si, O and Cl is particularly preferable among these doping agents.

While in the following embodiments a sapphire substrate and a C-plane {0001} substrate of nitride semiconductor will mainly be described among the substrates as described above, an A-plane {11-20}, an R-plane {1-102} or an M-plane {1-100} may be used other than the C-plane as a surface orientation of the main surface of the substrate. If a substrate has an off-angle within 2° from those surface orientations, the semiconductor crystal layer grown thereon has a good surface morphology.

Metal-organic chemical vapor deposition (MOCVD), molecular beam epitaxy (MBE), hydride vapor phase epitaxy (HVPE) and the like are generally used to grow the crystal layer. Among those, it is most general to use GaN or sapphire as a substrate and to use MOCVD to grow crystal, considering the crystallinity and productivity of the fabricated nitride semiconductor layer.

(Embodiment 1)

In the following, a nitride semiconductor laser diode device according to an embodiment 1 of the present invention will be described.

Figure 1:
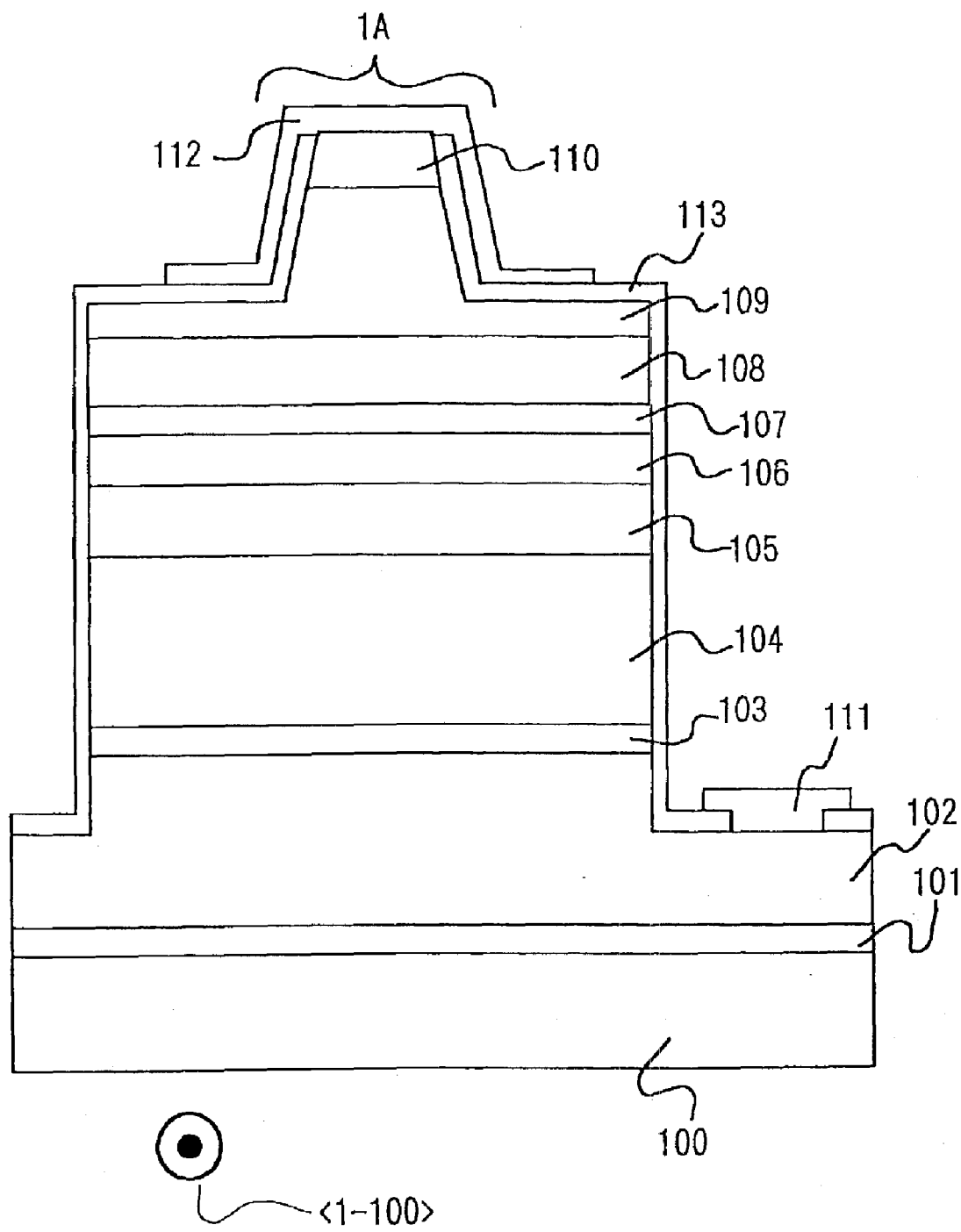
FIG. 1 is a schematic cross sectional view showing a structure of a nitride semiconductor laser device according to an embodiment of the present invention.

The nitride semiconductor laser diode device according to embodiment 1 shown in the schematic cross section of FIG. 1 includes a C-plane (0001) sapphire substrate 100, a GaN buffer layer 101, an n-type GaN contact layer 102, an n-type $In_{0.07}Ga_{0.93}N$ anti-cracking layer 103, an n-type $Al_{0.1}Ga_{0.9}N$ cladding layer 104, an n-type GaN light guide layer 105, an emission layer 106, a p-type $Al_{0.2}Ga_{0.8}N$ blocking layer 107, a p-type GaN light guide layer 108, a p-type $Al_{0.1}Ga_{0.9}$ cladding layer 109, a p-type GaN contact layer 110, an n-type electrode 111, a p-type electrode 112 and an $SiO_2$ dielectric film 113.

In fabrication of the laser diode device of FIG. 1, sapphire substrate 100 is first placed in an MOCVD apparatus, and GaN buffer layer 101 is grown to a thickness of 25 nm at a relatively low substrate temperature of 550° C. using $NH_3$ (ammonia) as a source for a group V element N and TMGa (trimethyl gallium) as a source for a group III element Ga.

Then, in addition to the sources for N and Ga described above, $SiH_4$ (silane) is also used to grow n-type GaN contact layer 102 (Si impurity concentration: $1 \times 10^{18}/cm^3$) to a thickness of 3 μm at a temperature of 1050° C. Thereafter, the substrate temperature is decreased to about 700° C. to 800° C., and using TMIn (trimethyl indium) as a source for a group III element In, n-type $In_{0.07}Ga_{0.93}N$ anti-cracking layer 103 is grown to a thickness of 40 nm. The substrate temperature is again increased to 1050° C., and using TMAl (trimethyl aluminum) as a source for a group III element Al, n-type $Al_{0.1}Ga_{0.9}N$ cladding layer 104 (Si impurity concentration: $1 \times 10^{18}/cm^3$) is grown to a thickness of 0.8 μm, followed by n-type GaN light guide layer 105 (Si impurity concentration: $1 \times 10^{18}/cm^3$) grown to a thickness of 0.1 μm.

Thereafter, the substrate temperature is decreased to 800° C. and emission layer 106 is formed having a multiple quantum well structure alternately stacked with a plurality of $Al_{0.02}In_{0.07}Ga_{0.9}N$ barrier layers of 6 nm thickness and a plurality of $GaN_{1-x}As_x$ (x=0.02) well layers of 4 nm thickness. In this embodiment, emission layer 106 has a multiple quantum well structure starting from the barrier layer and ending at the barrier layer and includes three quantum well layers. In growing these barrier layers and well layers, $SiH_4$ is added so that both of them have a Si impurity concentration of $1 \times 10^{18}/cm^3$. It is noted that a growth interruption interval of not less than one second and not more than 180 seconds may be inserted between the growth of the barrier layer and the well layer or between the growth of the well layer and the barrier layer. With the growth interruption intervals, the flatness of the barrier layers and the well layers is improved and then the emission half-width can be reduced.

Generally, the content of As, P or Sb in the well layer can be adjusted according to a targeted emission wavelength of a light emitting device. In order to obtain an emission wavelength in the vicinity of 410 nm of violet, for example, x may be 0.02 in $GaN_{1-x}As_x$, y may be 0.03 in $GaN_{1-y}P_y$ and z may be 0.01 in $GaN_{1-z}Sb_z$. Furthermore, in order to obtain an emission wavelength in the vicinity of 470 nm of blue, x may be 0.03 in $GaN_{1-x}As_x$, y may be 0.06 in $GaN_{1-y}P_y$ and z may be 0.02 in $GaN_{1-z}Sb_z$. In addition, in order to obtain an emission wavelength in the vicinity of 520 nm of green, x may be 0.05 in $GaN_{1-x}As_x$, y may be 0.08 in $GaN_{1-y}P_y$ and z may be 0.03 in $GaN_{1-z}Sb_z$. Still further, in order to obtain an emission wavelength in the vicinity of 650 nm of red, x may be 0.07 in $GaN_{1-x}As_x$, y may be 0.12 in $GaN_{1-y}P_y$ and z may be 0.04 in $GaN_{1-z}Sb_z$.

In a case where InGaNAs-based or InGaNP-based semiconductor is used for a well layer, the numeral values shown in Tables 1 and 2 may be employed as a value of a content proportion x depending on a content proportion y of In, in order to obtain the targeted emission wavelength.

TABLE 1

| | $In_yGa_{1-y}N_{1-x}As_x$ | | | | | | |
|---|---|---|---|---|---|---|---|
| | In(y = 0.01) | In(y = 0.02) | In(y = 0.05) | In(y = 0.1) | In(y = 0.2) | In(y = 0.35) | In(y = 0.5) |
| emission wavelength | | | | | | | |
| 400 nm | 0.012 | 0.011 | 0.008 | 0.003 | | | |
| 410 nm | 0.016 | 0.015 | 0.011 | 0.006 | | | |
| 470 nm | 0.034 | 0.033 | 0.029 | 0.024 | 0.014 | 0.001 | |
| 520 nm | 0.046 | 0.045 | 0.041 | 0.036 | 0.025 | 0.012 | 0.001 |
| 650 nm | 0.07 | 0.069 | 0.065 | 0.059 | 0.048 | 0.034 | 0.023 |

TABLE 2

| | $In_yGa_{1-y}N_{1-x}P_x$ | | | | | | |
|---|---|---|---|---|---|---|---|
| | In(y = 0.01) | In(y = 0.02) | In(y = 0.05) | In(y = 0.1) | In(y = 0.2) | In(y = 0.35) | In(y = 0.5) |
| emission wavelength | | | | | | | |
| 400 nm | 0.02 | 0.018 | 0.013 | 0.004 | | | |
| 410 nm | 0.025 | 0.023 | 0.018 | 0.01 | | | |
| 470 nm | 0.055 | 0.053 | 0.047 | 0.038 | 0.022 | 0.001 | |
| 520 nm | 0.075 | 0.073 | 0.067 | 0.058 | 0.041 | 0.019 | 0.001 |
| 650 nm | 0.116 | 0.114 | 0.107 | 0.097 | 0.079 | 0.055 | 0.036 |

After forming emission layer 106, the substrate temperature is again increased to 1050° C. to successively grow p-type $Al_{0.2}Ga_{0.8}N$ blocking layer 107 of 20 nm thickness, p-type GaN light guide layer 108 of 0.1 μm thickness, p-type $Al_{0.1}Ga_{0.9}N$ cladding layer 109 of 0.5 μm thickness and p-type GaN contact layer 110 of 0.1 μm thickness. It is noted that Mg may be added at a concentration of $5 \times 10^{19}$–$2 \times 10^{20}$/cm$^3$ using $EtCP_2Mg$ (bisethyl cyclopentadienyl magnesium) as a p-type impurity.

The p-type impurity concentration in p-type GaN contact layer 110 is preferably increased as it is closer to a junction surface with p-type electrode 112. Thus, the contact resistance with the p-type electrode may be reduced. Furthermore, in order to remove residual hydrogen which inhibits activation of Mg as a p-type impurity in the p-type layer, a small amount of oxygen may be introduced during growth of the p-type layer.

After growing p-type GaN contact layer 110, the entire gas in the reactor of the MOCVD apparatus is replaced with nitrogen carrier gas and $NH_3$ and then the substrate temperature is decreased at a rate of 60° C./min. At the time when the substrate temperature drops to 800° C., the supply of $NH_3$ is stopped and the substrate temperature is maintained at 800° C. for five minutes and is then decreased to the room temperature. It is noted that such a temperature temporarily held is preferably within 650° C. to 900° C., preferably for three to ten minutes. The cooling rate from the held temperature to the room temperature is preferably not less than 30° C./min.

Evaluation of the surface of the grown film by Raman measurement showed p-type characteristics immediately after the growth even without such annealing for attaining p-type conductivity as used in a conventional nitride semiconductor film. Furthermore, the contact resistance was reduced when p-type electrode 112 was formed.

When the emission layer contains As, P or Sb as in the present invention, the emission layer is liable to be easily damaged by heat (a reduced emission intensity, color unevenness and the like due to the phase separation) and it is undesirable to hold the substrate at a temperature higher than the growth temperature of the emission layer in an atmosphere other than $NH_3$ as it incurs a reduced emission intensity. Therefore, the technique of attaining p-type conductivity in the process of removing the substrate from the MOCVD apparatus as described above allows omission of annealing for p-type conductivity after removing the substrate and thus is very useful. It is noted that if the conventional annealing for attaining p-type conductivity is not omitted, an activation ratio of Mg is improved but the annealing time needs to be shortened (not more than ten minutes) at highest at the growth temperature of the emission layer or lower (approximately not more than 900° C.) in consideration of the damage of the emission layer. On the other hand, if annealing is performed after the side surface of emission layer 106 (904) (except a light radiation end surface in the case of a laser diode) is covered with dielectric, film 113 (910) as shown in FIG. 1 (or FIG. 6 or FIGS. 8(a) and 8(b)), escape of nitrogen or As (or P or Sb) from the emission layer can be prevented and the phase separation and segregation in the emission layer can be suppressed.

It is then described how to process the epitaxial wafer taken out of the MOCVD apparatus into laser diode devices.

A part of n-type GaN contact layer 102 is first exposed using a reactive ion etching apparatus, and n-type electrode 111 of stacked layers of Hf/Au in this order is formed on this exposed part. For this n-type electrode 111, stacked layers of Ti/Al, Ti/Mo, Hf/Al or the like can also be used. Hf is effective in reducing the contact resistance of the n-type electrode. In the p-type electrode portion, etching is performed in a striped manner along a <1-100> direction of sapphire substrate 100, $SiO_2$ dielectric film 113 is deposited, p-type GaN contact layer 110 is exposed and stacked layers of Pd/Au in this order are deposited, so as to form p-type electrode 112 having ridge stripe with a width of 2 μm. For this p-type electrode, stacked layers of Ni/Au, Pd/Mo/Au or the like can also be used.

Figure 2:
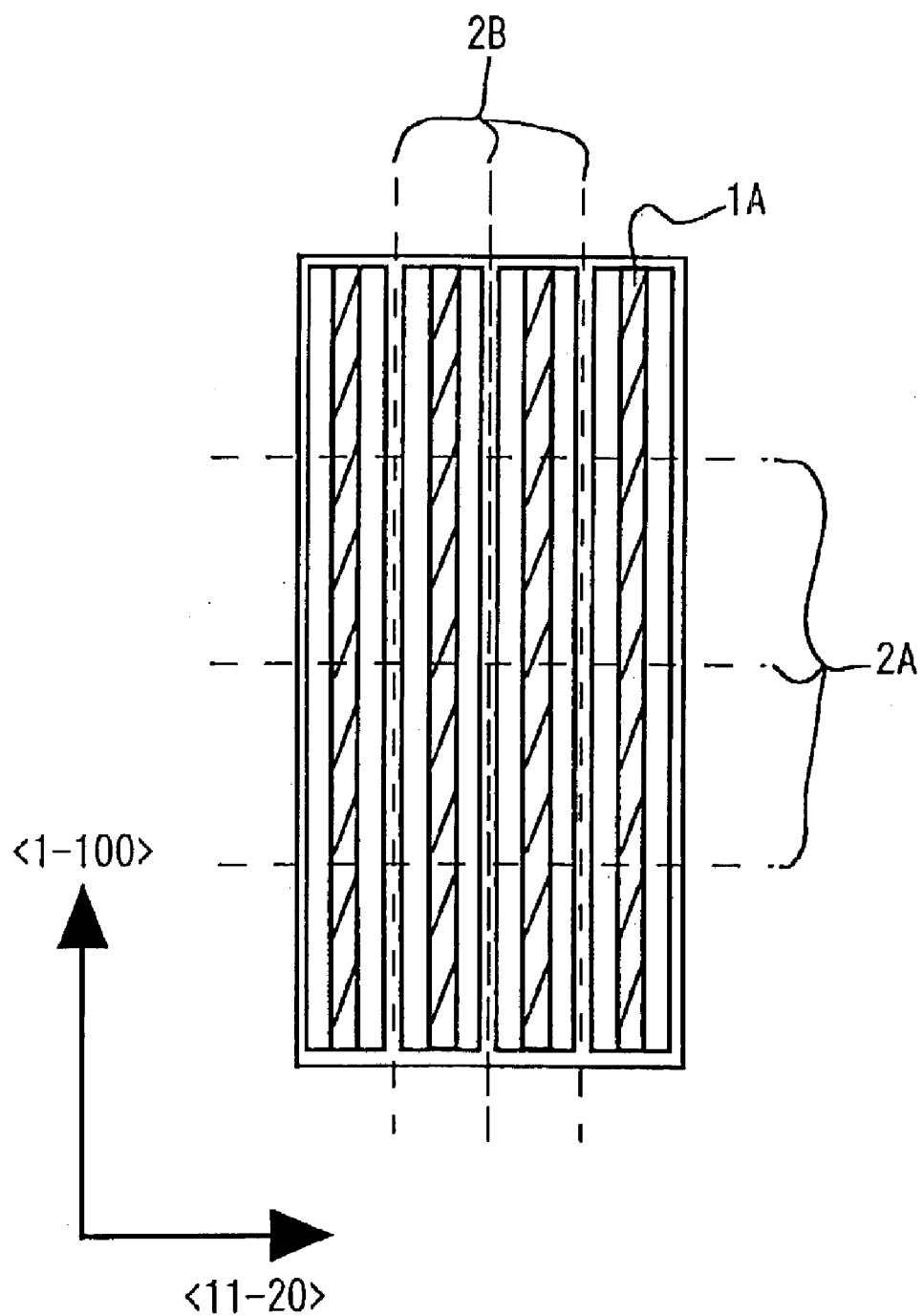
FIG. 2 is a schematic top view illustrating chip division of the laser device according to the embodiment.

Finally, a Fabry-Perot resonator having a resonator length of 500 μm is fabricated using cleavage or dry-etching. Preferably, the resonator length is generally within a range from 300 μm to 1000 μm. Mirror end surfaces of the resonator are formed to correspond to the M-plane of the sapphire substrate (see FIG. 2). Cleavage and laser chip division are carried out along dashed lines 2A and 2B in FIG. 2 from the substrate side using a scriber. In this manner, the flatness of the laser end surfaces can be attained and at the same time shavings caused from scribing are not adhered on the surface of the epitaxial layer, and as a result it becomes possible to obtain a good yield of the light emitting devices.

It is noted that the feed-back system of the laser resonator is not limited to a Fabry-Perot type and may include a generally-known DFB (Distribution Feed Back) type, a DBR (Distribution Bragg Reflection) type and the like, as a matter of course.

After forming the mirror end surfaces of the Fabry-Perot resonator, dielectric films of $SiO_2$ and $TiO_2$ are alternately deposited on each of the mirror end surfaces to form a dielectric multilayer reflection film having a refractive index of 70%. A multilayer formed of $SiO_2/Al_2O_3$ and the like can also be used as this dielectric multilayered reflection film.

It is noted that a portion of n-type GaN contact layer 102 is exposed using reactive ion etching because an insulative sapphire substrate 100 is used. Therefore, when such a substrate having conductivity as a GaN substrate or SiC substrate is used, a portion of n-type GaN layer 102 needs not be exposed and an n-type electrode may be formed on the rear surface of that conductive substrate. Furthermore, although a plurality of n-type layers, an emission layer and a plurality of p-type layers are successively crystal-grown from the substrate side in the embodiment above, a plurality of p-type layers, an emission layer and a plurality of n-type layers may be successively crystal-grown in the reversed order.

A method of packaging the laser diode chip as described above will now be described. First, if the laser diode including the emission layer as described above is used as a high power (50 mW) laser of violet (410 nm wavelength) suitable for a high density recording optical disk because of its characteristics, In solder material, for example, is preferably used to connect the chip to a package body with a semiconductor junction downward. Alternatively, instead of attaching the chip directly to the package body or a heat sink portion, such a submount having a good heat conductivity as of Si, AlN, diamond, MO, CuW, BN, SiC, Fe or Cu may be interposed for joint.

Figure 7:
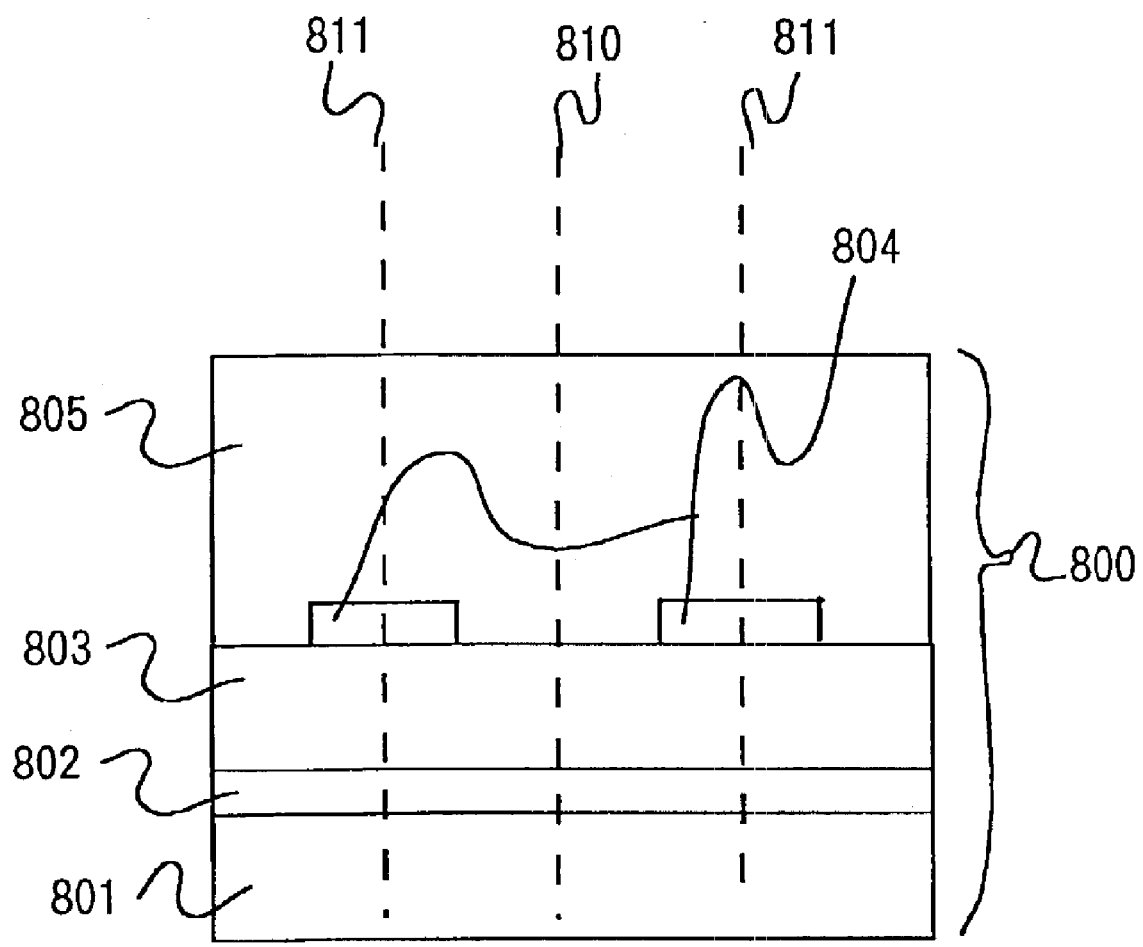
FIG. 7 is a schematic cross sectional view showing a nitride semiconductor thick-film substrate that may be used in the light emitting device according to the present invention.

On the other hand, if the nitride semiconductor laser diode including the emission layer as described above is formed on an SiC substrate, a nitride semiconductor substrate (for example, GaN substrate) or a GaN thick-film substrate (for example, the one formed by grinding and removing a seed substrate 801 from a substrate 800 shown in FIG. 7) having a good heat conductivity, In solder material, for example, can be used to connect the diode and the package body with the semiconductor junction upward. Also in this case, instead of attaching the substrate of the chip directly to the package body or the heat sink portion, such a submount as of Si, AlN, diamond, Mo, CuW, BN, SiC, Fe, Cu may be interposed for connection.

In this way, it is possible to fabricate a laser diode using nitride semiconductor containing As (or P or Sb) for the well layers included in the emission layer.

Further detailed description will now be made in conjunction with emission layer 106 included in the laser diode in the embodiment above.

Since the effective mass of electrons and holes is smaller in the well layer of the nitride semiconductor containing As, P or Sb as in the present invention as compared with the InGaN well layer currently in practical use, the laser threshold current density can be lowered as compared with the conventional case using the InGaN layer. This leads to realization of a laser device with lower power consumption, high output power and a longer life thereof.

If a mixed crystal ratio of As, P or Sb is higher in the nitride semiconductor crystal, however, phase separation of a hexagonal system having a high N concentration and a cubic system (zinc blende structure) occurs in the crystal. In order to suppress this, the well layer and the barrier layer included in the emission layer need to be prepared properly.

First, the well layer has to be grown at a temperature of not less than 700° C. and not more than 900° C. This is because the well layer containing As, P or Sb easily causes phase separation outside this growth temperature range.

Furthermore, the thickness of the well layer is preferably within a range of 0.4–20 nm. This is because in the case of a low content ratio of As, P or Sb in the well layer for example for a wavelength band of violet (around 400 nm), a region of phase separation can be suppressed to 3% or less if the thickness of the well layer is not more than 20 nm. In the case of a high content ratio of As, P or Sb in the well layer for example for a wavelength band of red (around 650 nm), a region having phase separation can be suppressed to 3% or less if the thickness of the well layer is not more than 5 nm. On the other hand, the thickness of the well layer needs to be not less than 0.4 nm, because the well layer having a thickness smaller than this value will not act as the emission area.

As to proper preparation of the barrier layer, first, in order to grasp the aforementioned phase separation phenomenon more precisely, an emission layer including GaNAs well layers/GaN barrier layers was fabricated and the interface of the emission layer was observed by a transmission electron microscope (TEM). As a result, phase separation was observed more significantly at an interface of the GaN layer on the GaNAs layer than at an interface of the GaNAs layer on the GaN layer. Furthermore, as the number of stacked well layers and barrier layers was increased, this tendency became more conspicuous, and the emission layer mostly suffered the phase separation in an area close to a epitaxial growth outermost surface.

Based on such a fact, it can be considered that the phase separation in the GaNAs well layer propagates one after another through the barrier layer on the well layer in contact therewith and the entire area of the emission layer suffers phase separation in the vicinity of the outermost surface. This suggests that in such an emission layer, it is difficult to form a multiple quantum well structure with a plurality of well layers and barrier layers alternately stacked. Furthermore, considering that phase separation is significant at the interface of the GaN layer on the GaNAs layer, an absorption ratio of Ga to As is presumably higher than that of Ga to N when the GaN layer is grown on the GaNAs layer. In addition, although it is basically preferable that the GaN crystal is grown at 1000° C. or higher, the GaN layer has to be grown at the same temperature as the well layer in order to suppress the phase separation in the well layer, and then it is considered that lowered crystallinity of GaN presumably increases the absorption ratio of Ga to As. In further addition, although the temperature needs to be increased to 1000° C. or higher in growing the p-type layer on the emission layer, such a high temperature is more likely to cause As segregation on the surface of the GaNAs well layer, and phase separation is presumably induced by internal diffusion of As at the interface between the well layer and the barrier layer.

The phase separation as described above may similarly occur also in another nitride semiconductor well layer containing As, P or Sb as in a well layer of GaNP, GaNSb, GaNAsPSb, InGaNAs, InGaNP, InGaNSb InGaNAsPSb or the like. It is noted that a well layer containing at least As, P or Sb and also containing Al may attain an effect similar to that in a barrier layer according to the present invention described later and may preferably be used. For example, AlInGaNAs, AlInGaNP, AlInGaNSb, AlInGaNAsPSb or the like may be used for a well layer.

In order to suppress phase separation in the well layer, a barrier layer of nitride semiconductor containing Al is desired. Al has high vapor-phase reactivity. Therefore, before Al atoms reach the surface of the epitaxial wafer, they mostly forms nitride semiconductor crystalline nuclei containing Al to deposit on the wafer surface. Since Al has strong chemical binding force, when the stable barrier layer is stacked on the well layer containing As, P or Sb, recrystallization due to binding with As (or P or Sb) does not take place. Furthermore, the stable barrier layer may also act to prevent the escape of As (or P or Sb) or N from the well layer.

In addition, even if the substrate temperature is increased to a temperature higher than the growth temperature of the well layer (1000° C. or higher) in order to stack a p-type layer, diffusion into the barrier layer due to segregation of As (or P or Sb) hardly occurs since the nitride semiconductor crystal containing Al can be stably present. Therefore, the barrier layer containing Al may act to prevent propagation of influence of the phase separation from one well layer to another well layer. In other words, the use of the barrier layer containing Al makes it possible to fabricate a multiple quantum well structure.

Generally, the nitride semiconductor crystal containing Al, however, has poor crystallinity unless the growth temperature is increased (to 900° C. or higher). However, the growth temperature of the barrier layer can be decreased to the same level as the growth temperature of the well layer by adding any of elements As, P, Sb and In into the barrier layer. Thus, phase separation in the emission layer resulting from a high growth temperature of the barrier layer can be prevented and at the same time the crystallinity of the barrier layer can be improved. The respective contents of As, P and Sb in the group V elements in such a barrier layer are preferably not more than 7.5% for As, not more than 10% for P and not more than 2.5% for Sb. This is because if the content of As, P or Sb is too high, phase separation starts to occur even with the barrier layer containing Al. Furthermore, In content in the group III elements in the barrier layer may be not more than 15%. This is because concentration separation, which was observed in the conventional InGaN, is hardly seen with not more than 15% of In, as the barrier layer contains Al.

Furthermore, In may be further added into the barrier layer containing element Al and As, P or Sb. This is because inclusion of In reduces the energy band gap in the barrier layer so that the content of As, P or Sb can be reduced.

The thickness of the barrier layer is preferably not less than 1 nm and not more than 20 nm. Although the thickness of the barrier layer is preferably equal to or smaller than that of the well layer in order to form a subband by a multiple quantum well structure, it is preferably equal to or slightly larger than that of the well layer in order to block the influence of the phase separation in the well layer.

As to addition of the impurity in the emission layer, although $SiH_4$ (Si) is added to both the well layer and the barrier layer as an impurity in this embodiment, laser excitation is possible even when the impurityi is added only to either of the layers or to neither of the layers. According to a photoluminescence (PL) measurement, however, the PL emission intensity is about 1.2 to 1.4 times stronger in the case where $SiH_4$ is added to both the well layer and the barrier layer as compared with the case where it is not added. Thus, an impurity such as $SiH_4$ (Si) is preferably added in the emission layer in the light emitting diode. Since the well layer according to the present invention is formed as a mixed crystal system including As, P or Sb, localized energy levels due to In are less likely to be formed as compared with InGaN crystal including no As, P and Sb even though In is contained in the well layer. Therefore, it can be considerd that the emission intensity has strong dependency on the crystallinity of the well layer. Thus, it is necessary to improve the crystallinity of the emission layer by adding an impurity such as Si. More specifically, the crystallinity is improved by producing nuclei for crystal growth by such an impurity and crystal-growing the well layer based on the nuclei. Although Si ($SiH_4$) is added at a concentration of $1 \times 10^{18}/cm^3$ in this embodiment, O, S, C, Ge, Zn, Cd, Mg or the like other than Si may also be added to attain a similar effect. The concentration of these added atoms is preferably about $1 \times 10^{16} - 1 \times 10^{20}/cm^3$.

Generally, in the case of a laser diode, modulation dope in which an impurity is added only to the barrier layer can reduce laser excitation threshold current density because of no carrier absorption in the well layer. On the contrary, the threshold value was lower when an impurity is added in the well layer according to the present invention. Presumably, this is because the crystal growth in the present embodiment starting from a sapphire substrate different from a nitride semiconductor substrate causes many crystal defects (threading dislocation density is about $1 \times 10^{10}/cm^2$), and thus improving the crystallinity by addition of the impurity is more effective in reducing the laser threshold current density rather than considering carrier absorption by the impurity in the well layer.

In order to further reduce the laser excitation threshold current density, the number of well layers is preferably not less than two and not more than five. Furthermore, the threshold current density is found to be lower when a GaN substrate is used rather than a sapphire substrate.

On emission layer 106, p-type AlGaN blocking layer 107 and p-type layer 108 are provided to stack in this order. This p-type layer 108 corresponds to a p-type light guide layer in a laser diode and corresponds to a p-type cladding layer or a p-type contact layer in a light emitting diode.

According to the PL measurement, in comparison between the presence and the absence of blocking layer 107, a shift amount from a designed emission wavelength was smaller and the PL emission intensity was stronger in the presence of the blocking layer. As described in connection with the emission layer of the laser diode above, as compared with emission layer 106, p-type layer 108 thereover is formed at a higher growth temperature and thus acts to assist phase separation in the emission layer. It is considered, however, that the phase separation in the emission layer may be suppressed and the influence from emission layer 106 containing As, P or Sb (for example, phase separation) can be prevented from propagating to p-type layer 108 by providing blocking layer 107 containing Al at the interface between the emission layer and the p-type layer. Particularly, when emission layer 106 has a structure shown in FIG. 3(b) in which emission layer having a multiple quantum well structure starts at the well layer and ends at the well layer, the effect of blocking layer 107 is noticeable.

In light of the foregoing, it is important that blocking layer 107 contains at least Al. Furthermore, the polarity of the blocking layer is preferably p-type. This is because unless the blocking layer is p-type, the position of a pn junction in the vicinity of the emission layer changes, causing reduced luminous efficiency.

Similarly to the case described above, an n-type AlGaN blocking layer may be provided between emission layer 106 and n-type layer 105 to be into contact therewith. This n-type layer 105 corresponds to an n-type light guide layer in the case of a laser diode and corresponds to an n-type cladding layer or an n-type contact layer in the case of a light emitting diode. The effect of such an n-type AlGaN blocking layer is approximately similar to that of p-type AlGaN blocking layer 107.

Figure 3A:
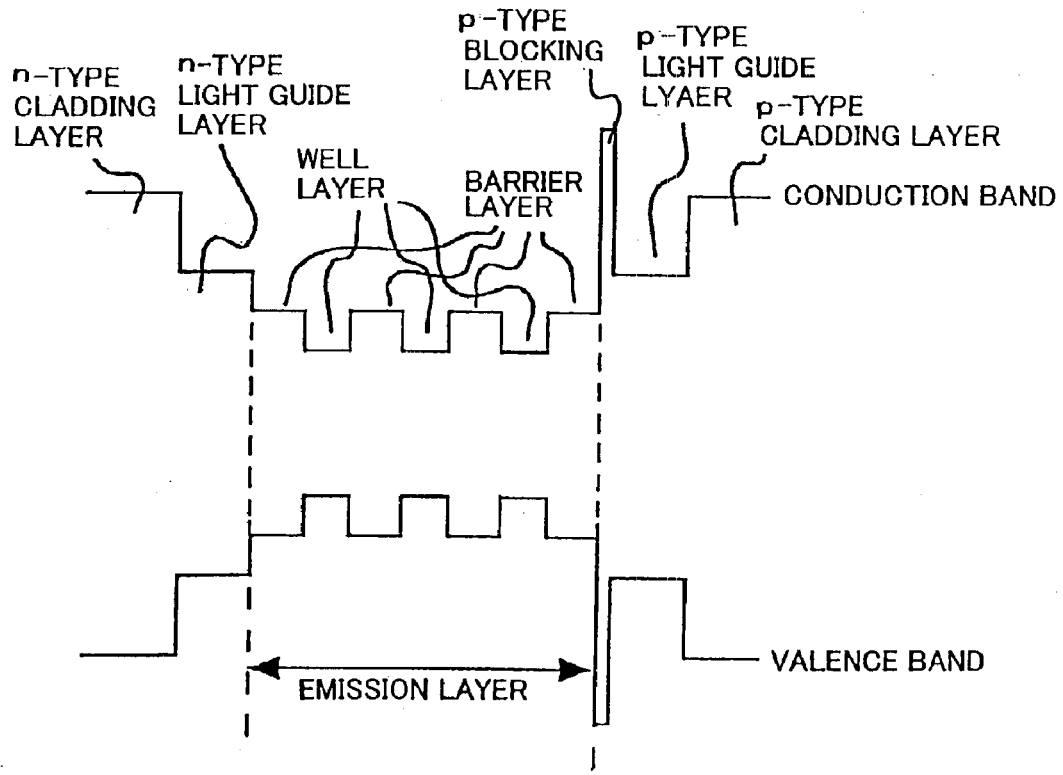
FIGS. 3(a) and 3(b) are diagrams schematically showing energy band gap structures in the light emitting devices according to the embodiments.
Figure 5:
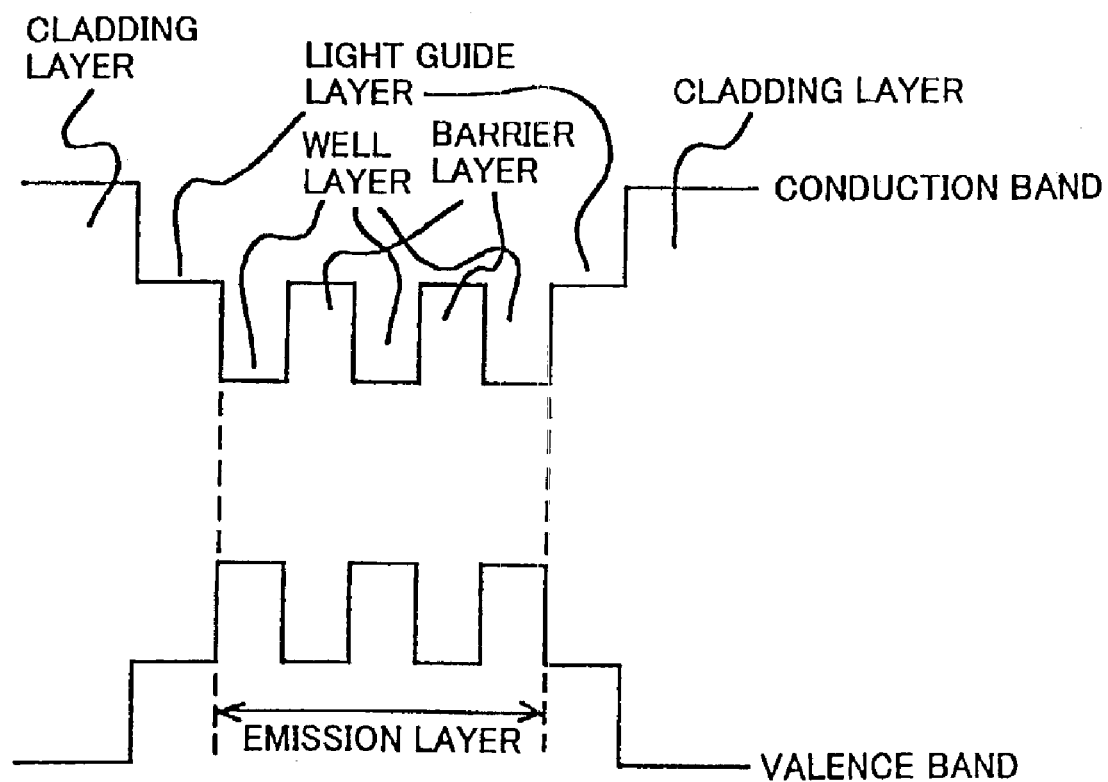
FIG. 5 is a diagram schematically showing the energy band gap structure in a conventional light emitting device.

As to the band gap structure of the emission layer, FIG. 5 shows a conventional band gap structure (Japanese Patent Laying-Open No. 10-270804) and FIG. 3(a) shows the band gap structure of this embodiment. In the conventional band gap structure shown in FIG. 5, a cladding layer is formed of AlGaN, a light guide layer is formed of GaN, a barrier layer is formed of GaN and a well layer is formed of GaNAs. As the light guide layer and the barrier layer are made of the same nitride semiconductor material, they have the same energy band gap and refractive index. Therefore, this case hardly causes the subband due to the multiple quantum well effect but causes a decrease in a gain (an increase in the threshold current density) in the case of a laser diode and an increase in a half-width of wavelength (which causes color irregularity) in the case of a light emitting diode. Furthermore, in the case of the AlGaN cladding layer/GaN light guide layer, a refractive index difference therebetween is originally small and the barrier layer is also formed of GaN, so that the light confinement efficiency is small and the vertical lateral mode characteristics are not good.

Therefore, in this embodiment as shown in FIG. 3(a), the energy band gap of the barrier layer is made small as compared with the light guide layer. Accordingly, the multiple quantum well effect causing the subband is more easily obtained as compared with the conventional embodiment shown in FIG. 5, and the light confinement efficiency is improved with the refractive index of the barrier layer larger than that of the light guide layer, causing improvement of the vertical lateral mode characteristics (attaining a unimodal mode). Particularly, when the barrier layer contains As, P or Sb, the increasing tendency of the refractive index is preferably noticeable.

Figure 3B:
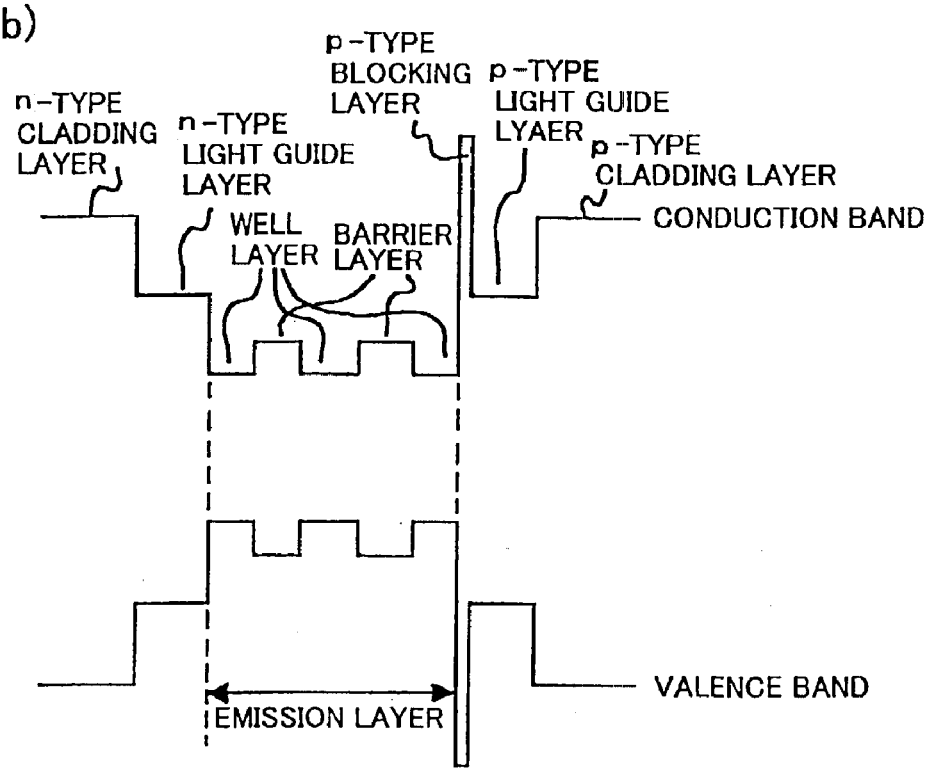
Figure 4A:
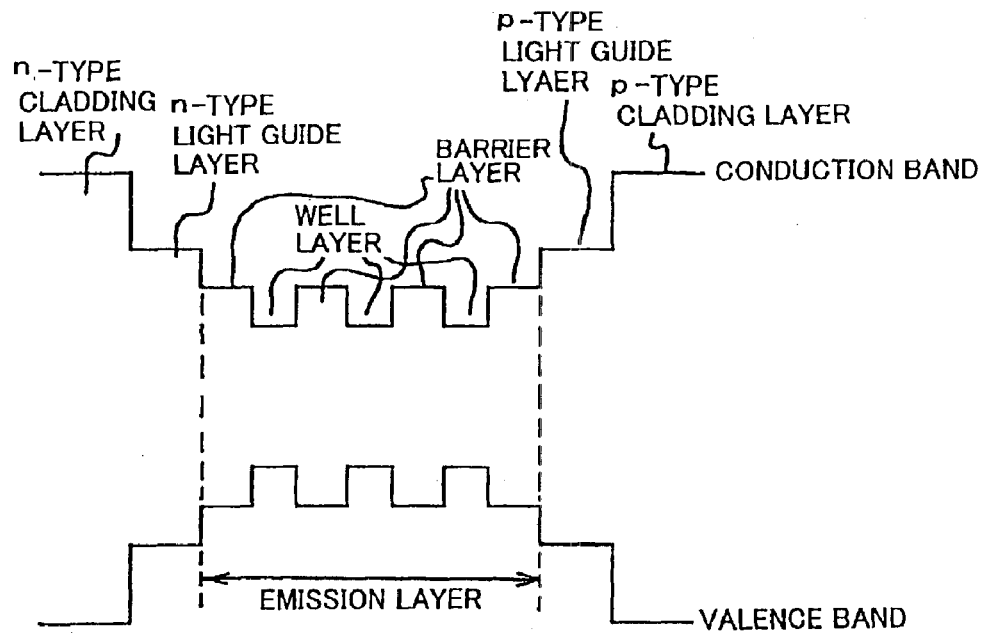
FIGS. 4(a) and 4(b) are diagrams schematically showing other examples of the energy band gaps in the light emitting devices according to the embodiments.
Figure 4B:
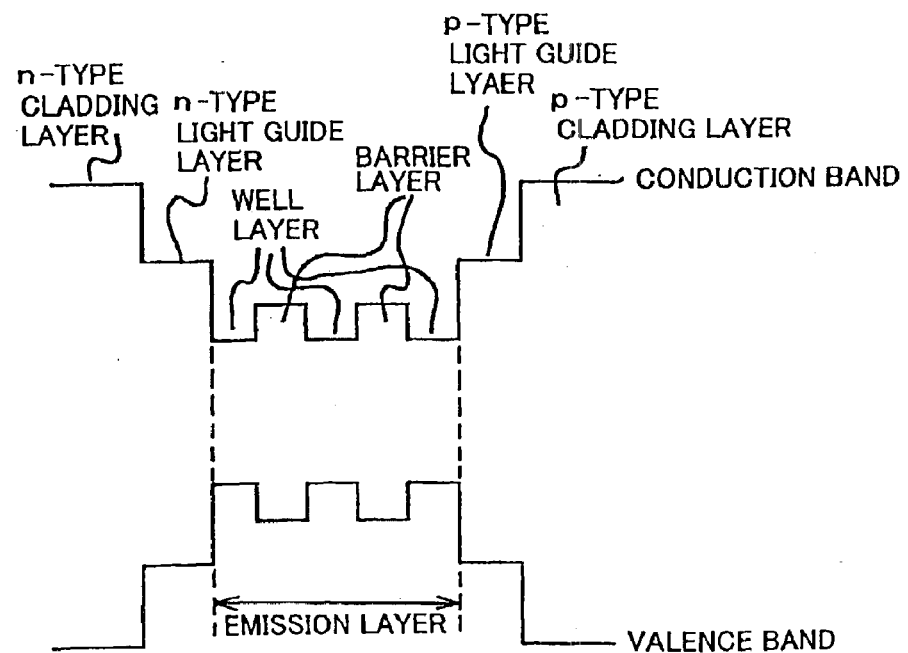

The emission layer where the energy band gap of the barrier layer is smaller than that of the light guide layer as describe above can employ two kinds of configurations as shown in FIGS. 3(a) and 3(b). Specifically, the emission layer having a multiple quantum well structure may employ either of a configuration starting from a barrier layer and ending at a barrier layer or a configuration starting from a well layer and ending at a well layer. The possible band gap structures of the emission layer without a blocking layer are as shown in FIGS. 4(a) and 4(b).

(Embodiment 2)

Embodiment 2 uses a variety of nitride semiconductor materials for the well layer and the barrier layer in the emission layer having a multiple quantum well structure as described in embodiment 1. The combinations of nitride semiconductor materials for the well layer and the barrier layer are shown in Table 3.

described above, unless the growth temperature of the well layer of the present invention is not less than 700° C. and not more than 900° C., phase separation of different crystal systems occurs in the well layer. However, since a proper growth temperature of the AlGaN barrier layer is not less than 900° C., phase separation occurs in the well layer if the barrier layer is grown at that proper growth temperature. On the other hand, if the barrier layer is grown at a growth temperature proper for the well layer (not less than 700° C. and not more than 900° C.), crystallinity of the AlGaN barrier layer is undesirably deteriorated. The only temperature suitable for both the AlGaN barrier layer and the well layer is 900° C., so that the crystal growth range is narrow and controllability is poor.

Though the well layer contains any of elements As, P and Sb in Table 3, it may contain these plural kinds of elements. Specifically it may be a mixed crystal of $XGaN_{1-x-y}As_xP_ySb_z$ ($0 \leq x \leq 0.15$, $0 \leq y \leq 0.2$, $0 \leq z \leq 0.05$, x+y+z>0), where X represents one or more kinds of group III elements. It is noted that the other conditions for the emission layer using these nitride semiconductor materials are similar to those in embodiment 1.

(Embodiment 3)

Figure 6:
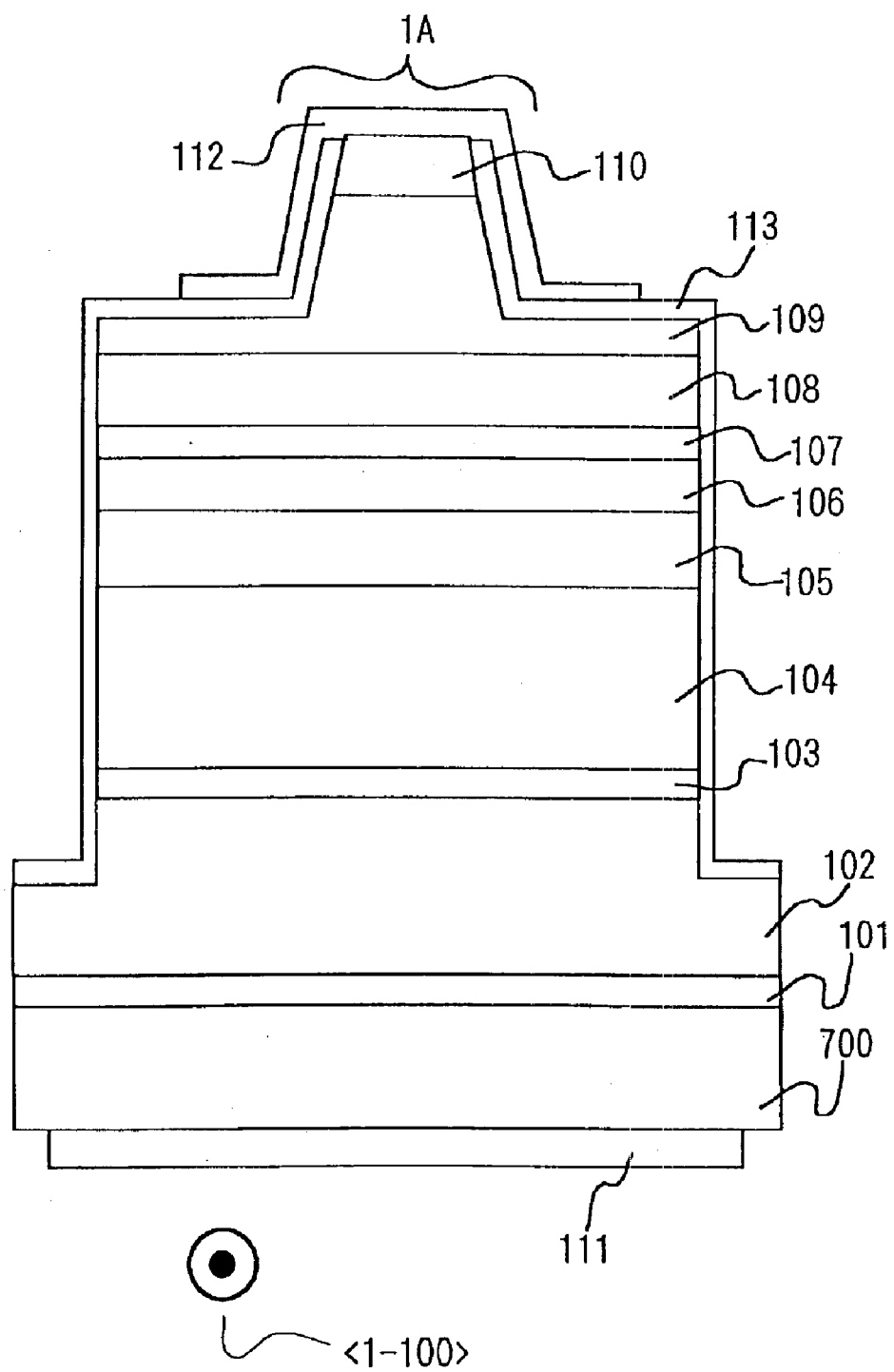
FIG. 6 is a schematic cross sectional view showing a structure of a laser device using a nitride semiconductor substrate as an embodiment.

In embodiment 3 shown in FIG. 6, n-type GaN substrate 700 having a C-plane ({0001}plane) as a main surface was used in place of sapphire substrate 100 used in embodiment 1. When the GaN substrate is used, GaN buffer layer 101 may be omitted and n-type GaN layer 102 maybe grown directly on the GaN substrate. Since the GaN substrate commercially available at present does not have good enough crystallinity and surface morphology, however, GaN buffer layer 101 is preferably inserted in order to improve these.

Since n-type GaN substrate 700 is used in embodiment 3, n-type electrode 111 can be formed on the rear surface of GaN substrate 700. Furthermore, since the GaN substrate can have a very flat cleavage end surface, a Fabry-Pérot resonator having a resonator length of 300 μm can be fabricated with a small mirror loss. It is noted that similarly to embodiment 1 the resonator length is preferably within a range from 300 μm to 1000 μm in general. The mirror end

TABLE 3

| well layer | barrier layer | | | | | | | |
|---|---|---|---|---|---|---|---|---|
| | AlGaN | AlGaNAs | AlGaNP | AlGaNSb | InAlGaN | InAlGaNAs | InAlGaNP | InAlGaNSb |
| GaNAs | Δ | ⊙ | ⊙ | ⊙ | ⊙ | ⊙ | ⊙ | ⊙ |
| GaNP | Δ | ⊙ | ⊙ | ⊙ | ⊙ | ⊙ | ⊙ | ⊙ |
| GaNSb | Δ | ⊙ | ⊙ | ⊙ | ⊙ | ⊙ | ⊙ | ⊙ |
| InGaNAs | Δ | ⊙ | ⊙ | ⊙ | ⊙ | ⊙ | ⊙ | ⊙ |
| InGaNP | Δ | ⊙ | ⊙ | ⊙ | ⊙ | ⊙ | ⊙ | ⊙ |
| InGaNSb | Δ | ⊙ | ⊙ | ⊙ | ⊙ | ⊙ | ⊙ | ⊙ |
| AlGaNAs | Δ | ⊙ | ⊙ | ⊙ | ⊙ | ⊙ | ⊙ | ⊙ |
| AlGaNP | Δ | ⊙ | ⊙ | ⊙ | ⊙ | ⊙ | ⊙ | ⊙ |
| AlGaNSb | Δ | ⊙ | ⊙ | ⊙ | ⊙ | ⊙ | ⊙ | ⊙ |
| InAlGaNAs | Δ | ⊙ | ⊙ | ⊙ | ⊙ | ⊙ | ⊙ | ⊙ |
| InAlGaNP | Δ | ⊙ | ⊙ | ⊙ | ⊙ | ⊙ | ⊙ | ⊙ |
| InAlGaNSb | Δ | ⊙ | ⊙ | ⊙ | ⊙ | ⊙ | ⊙ | ⊙ |

In Table 3, Δ mark shows a less preferable combination of nitride semiconductor materials for the well layer and the barrier layer and ⊙ mark shows a preferable combination. It is noted that only an AlGaN barrier layer is less preferable in Table 3 for the reason as follows. Specifically, as surfaces of the resonator are formed to correspond to {1-100} plane of GaN substrate 700. The cleavage and division for laser chips are performed from the substrate side using a scriber as in FIG. 2 explained above. Furthermore, the aforementioned DFB or DBR may be used as a feed-back system of the laser resonator, as a matter of course. It is needless to say that a dielectric multilayer reflection film similar to that of the first embodiment may be formed on the mirror end surface.

By using a GaN substrate in place of a sapphire substrate, the thicknesses of n-type AlGaN cladding layer 104 and p-type AlGaN cladding layer 109 can be increased without causing cracks in the epitaxial wafer. Preferably, the thickness of the AlGaN cladding layer is set within 0.8 μm to 1.8 μm. As a result, the unimodal vertical lateral mode and the light confinement efficiency are improved, the optical property of the laser device can be improved, and the laser threshold current density can be reduced.

The characteristics of the well layer included in the emission layer according to the present invention have strong dependency on the crystallinity (crystal defects) of the well layer as described above. Therefore, if a nitride semiconductor laser diode device including the well layer is fabricated using a GaN substrate as in the present embodiment, the crystal defect density in the emission layer (for example, threading dislocation density) is reduced and thus the laser excitation threshold current density is reduced by 10% to 20% as compared with embodiment 1 using a sapphire substrate.

It is noted that the other conditions for the emission layer in the present embodiment are similar to those in embodiment 1. As to impurity concentration in the emission layer, however, the laser threshold current density was reduced as compared with embodiment 1 by modulation dope in which an impurity is added only in the barrier layer or by adding an impurity at a concentration of not more than $3 \times 10^{18}/cm^3$ to the well layer. This is because the crystallinity of the emission layer was presumably improved as compared with the case using the sapphire substrate.

(Embodiment 4)

Embodiment 4 is similar to embodiment 1 or 3 except that sapphire substrate 100 in embodiment 1 was replaced by a substrate 800 shown in FIG. 7. Substrate 800 in FIG. 7 includes a seed substrate 801, a buffer layer 802, an n-type GaN film 803, a dielectric film 804 and an n-type GaN thick film 805, which are successively stacked.

In fabricating substrate 800, buffer layer 802 is first stacked on seed substrate 801 by MOCVD at a relatively low temperature of 550° C. Then n-type GaN film 803 of 1 μm thickness is formed thereon with doping of Si at a temperature of 1050° C.

The wafer including seed substrate to n-type GaN film 803 is taken out of the MOCVD apparatus and then dielectric film 804 is formed in a thickness of 100 nm using sputtering, CVD or EB deposition. Dielectric film 804 is processed into a periodic striped pattern by a lithography technique. These stripes are along <1-100> direction of n-type GaN film 803 and has a periodic pitch of 10 μm and a width of 5 μm in a <11-20> direction perpendicular to <1-100>.

The wafer including dielectric film 804 processed in a striped pattern is placed in an HVPE apparatus, and n-type GaN thick film 805 having an Si concentration of $1 \times 10^{18}/cm^3$ and a thickness of 350 μm is deposited at a growth temperature of 1100° C.

The wafer including n-type GaN thick film 805 was taken out of the HVPE apparatus, and a laser diode similar to embodiment 1 (see FIG. 1) was fabricated thereon. In embodiment 4, however, a ridge stripe portion 1A of the laser diode was formed so as not to be positioned just on lines 810 and 811 in FIG. 7. This is because it is preferable that the laser device is fabricated selectively on a portion having a low threading dislocation density (crystal defect density). The characteristics of the laser diode thus fabricated in embodiment 4 were basically similar to those of embodiment 3.

It is noted that substrate 800 from which seed substrate 801 has been removed by a grinder may also be used as a substrate for a laser diode. Furthermore, substrate 800 from which buffer layer 802 and all the lower layers have been removed by a grinder may also be used as a laser diode substrate. Still further, substrate 800 from which dielectric film 804 and all the lower layers have been removed by a grinder may also be used as a substrate for a laser diode. If seed substrate 801 is removed, n-type electrode 111 can be formed on the rear surface of the substrate similarly as in embodiment 3. It is noted that seed substrate 801 may be removed after fabricating the laser diode structure over substrate 800.

In fabricating the aforementioned substrate 800, any of C-plane sapphire, M-plane sapphire, A-pane sapphire, R-plane sapphire, GaAs, ZnO, MgO, Spinel, Ge, Si, 6H-SiC, 4H-SiC, 3C-SiC and the like may be used as seed substrate 801. Any of a GaN layer, an AlN layer, an $Al_xGa_{1-x}N$ (0<x<1) layer or an $In_yGa_{1-y}N$ (0<y≦1) layer grown at a relatively low temperature of 450° C. to 600° C. may be used as buffer layer 802. Any of an $SiO_2$ film, an $SiN_x$ film, a $TiO_2$ film or an $Al_2O_3$ film may be used as dielectric film 804. N-type GaN thick film 805 may be replaced with n-type type $Al_wGa_{1-w}N$ (0<w≦1) thick film of which thickness may be not less than 20 μm.

(Embodiment 5)

In embodiment 5, the materials of the light guide layer of embodiment 1 were varied. Although both of n-type light guide layer 105 and p-type light guide layer 108 were formed of GaN in embodiment 1, a part of nitrogen atoms of these GaN layers may be replaced with any of element As, P or Sb. Specifically, a light guide layer of $GaN_{1-x-y-z}As_xP_ySb_z$ (0≦x≦0.075, 0≦y≦0.1, 0≦z≦0.025, x+y+z>0) can be used.

In the conventional AlGaN cladding layer/GaN light guide layer, even if the Al content in the cladding layer is increased, the refractive index difference between these layers is small and lattice mismatch is increased, leading to cracking or deteriorated crystallinity. On the other hand, in the case of a combination of an AlGaN cladding layer and a GaNAsPSb light guide layer, an energy gap difference as well as a refractive index difference are increased with a small amount of lattice mismatch as compared with the conventional embodiment, due to significant bowing effect in the band gap caused by As, P or Sb. Thus, laser light can efficiently be confined and vertical lateral mode characteristics (a unimodal mode) are improved in the nitride semiconductor laser diode device.

As to a composition ratio in the $GaN_{1-x-y-z}As_xP_ySb_z$ (0≦x≦0.075, 0≦y≦0.1, 0≦z≦0.025, x+y+z>0) light guide layer, a composition ratio of x, y and z may be adjusted such that the light guide layer has a larger energy band gap as compared with the barrier layer in the emission layer. For example, in the $GaN_{1-x}As_x$ light guide layer in a violet laser (410 nm wavelength) device, a composition ratio x of As is adjusted to not more than 0.02, in the case of the $GaN_{1-y}P_y$ light guide layer, a composition ratio y of P is adjusted to not more than 0.03, and in the case of the $GaN_{1-z}Sb_z$ light guide layer, a composition ratio z of Sb is adjusted to not more than 0.01. It is noted that the other conditions for the emission layer in embodiment 5 are similar to those in embodiment 1.

(Embodiment 6)

Figure 8:
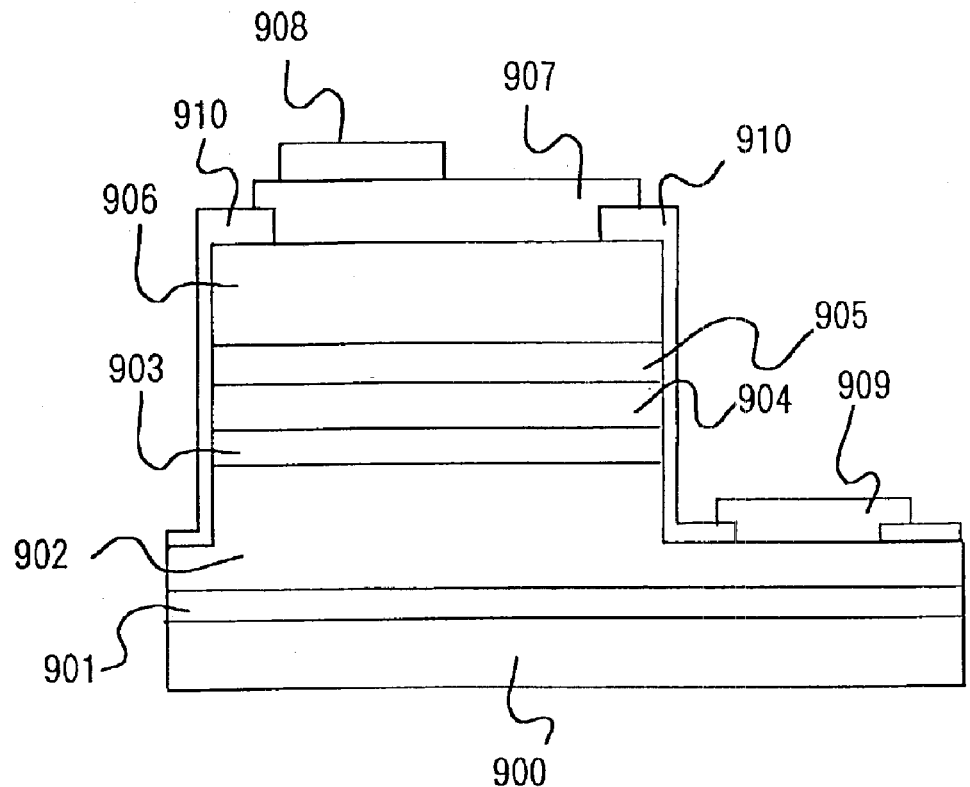
FIG. 8(a) is a schematic cross sectional view showing an exemplary light emitting diode device according to the present invention and FIG. 8(b) is a schematic top view corresponding to the diode device of FIG. 8(a).
Figure 8:
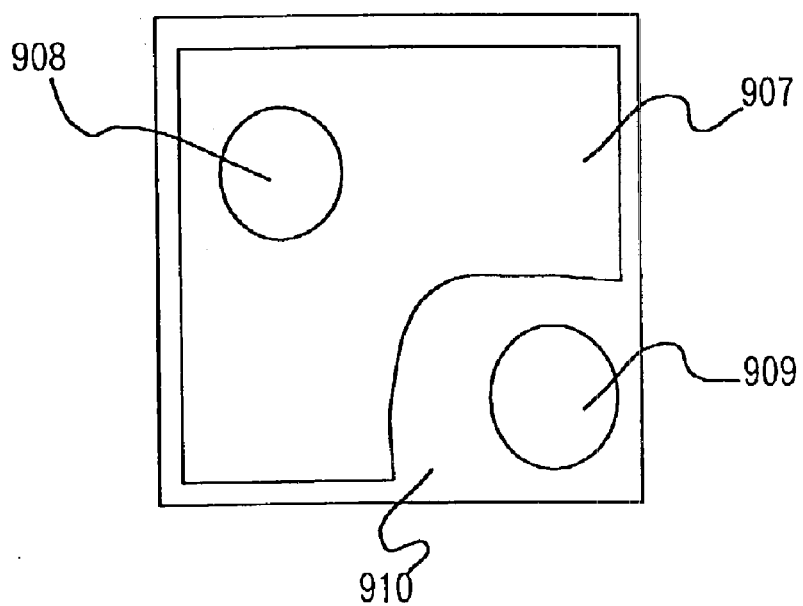

Embodiment 6 is for a nitride semiconductor light emitting diode device. FIG. 8(a) is a longitudinal sectional view and FIG. 8(b) is a top view schematically showing the nitride semiconductor light emitting diode device in embodiment 6.

The light emitting diode device in FIG. 8(a) includes a C-plane (0001) sapphire substrate 900, a GaN buffer layer 901 (30 nm thick), an n-type GaN layer contact 902 (3 μm thick, Si impurity concentration $1\times10^{18}$/cm$^3$), an n-type $Al_{0.1}Ga_{0.9}N$ blocking and cladding layer 903 (20 nm thick, Si impurity concentration $1\times10^{18}$/cm$^3$), an emission layer 904, a p-type $Al_{0.1}Ga_{0.9}N$ blocking and cladding layer 905 (20 nm thick, Mg impurity concentration $6\times10^{19}$/cm$^3$), a p-type GaN contact layer 906 (200 nm thick, Mg impurity concentration $1\times10^{20}$/cm$^3$), a transparent p-type electrode 907, a pad electrode 908, an n-type electrode 909 and a dielectric film 910.

It is noted that n-type $Al_{0.1}Ga_{0.9}N$ blocking and cladding layer 903 may be omitted in such a light emitting diode device. Furthermore, p-type electrode 907 may be formed of Ni or Pd, pad electrode 908 may be formed of Au, and n-type electrode 909 may be formed of a stack of Hf/Au, Ti/Al, Ti/Mo or Hf/Al.

In the emission layer of the present embodiment, SiH$_4$ (Si impurity concentration of $5\times10^{17}$/cm$^3$) is added respectively to the well layer and the barrier layer. It is noted that the nitride semiconductor materials for these well and barrier layers are similar to those in embodiment 1. Furthermore, if a GaN substrate is used in place of the sapphire substrate, an effect similar to that in embodiment 3 is achieved, and if a substrate shown in FIG. 7 is used, an effect similar to that in embodiment 4 is achieved. Furthermore, as the GaN substrate is conductive, both of p-type electrode 907 and n-type electrode 909 may be formed on one side of the light emitting device as shown in FIG. 8(b), while an n-type electrode may be formed on the rear surface of the GaN substrate and a transparent p-type electrode may be formed on the epitaxial outermost surface.

It is noted that the conditions for the well layer and the barrier layer included in emission layer 904 in this embodiment 6 are similar to those in embodiment 1.

(Embodiment 7)

Embodiment 7 is for a nitride semiconductor superluminescent diode device. The configuration and crystal growth method is similar to that described in embodiment 1. It is noted that if a GaN substrate is used in place of the sapphire substrate, an effect similar to embodiment 3 is achieved and if the substrate shown in FIG. 7 is used, an effect similar to embodiment 4 is achieved. Furthermore, relation between the emission intensity and the number of well layers included in the emission layer is similar to that shown in embodiment 6.

(Embodiment 8)

In embodiment 8, C of $1\times10^{20}$/cm$^3$ was added in place of the impurity Si to the well layer and the barrier layer in the emission layer shown in embodiments 1, 3, 4, 6 and 7. In this manner, C used in place of the impurity Si in the well layer and the barrier layer caused the similar effect.

(Embodiment 9)

In embodiment 9, Mg of $1\times10^{16}$/cm$^3$ was added in place of Si as an impurity to the well layer and the barrier layer in the emission layer shown in embodiments 1, 3, 4, 6 and 7. In this manner, Mg used in place of Si as an impurity in the well layer and the barrier layer caused the similar effect.

(Embodiment 10)

In embodiment 10, although the well layers and the barrier layers included in the emission layer shown in embodiments 1, 3, 4, 6 and 7 were changed to five-cycle $GaN_{0.98}P_{0.02}$ well layers (2 nm thick)/$Al_{0.01}In_{0.06}Ga_{0.93}N$ barrier layers (4 nm thick), an effect similar to that in each embodiment was achieved.

(Embodiment 11)

Embodiment 11 differs from each of embodiments 1, 3, 4, 6 and 7 only in that the well layers and the barrier layers included in the emission layer were changed to ten-cycle $GaN_{0.95}Sb_{0.05}$ well layers (0.4 nm thick)/GaN barrier layers (1 nm thick, Al impurity concentration of $5\times10^{18}$/cm$^3$). The PL measurement was performed on the light emitting device of embodiment 11 and the conventional light emitting device. While a plurality of emission wavelength peaks resulting from phase separation in the emission layer was observed in the conventional device including GaN barrier layers free of Al, only one emission wavelength peak was observed in the device of embodiment 11. This suggests that phase separation in the emission layer was suppressed in the light emitting device according to embodiment 11.

(Embodiment 12)

In embodiment 12, although the well layers and the barrier layers included in the emission layer shown in embodiments 1, 3, 4, 6 and 7 were changed to two-cycle $GaN_{0.97}As_{0.03}$ well layers (6 nm thick)/$In_{0.04}Al_{0.02}Ga_{0.94}N_{0.99}P_{0.01}$ barrier layers (6 nm thick), an effect similar to that of each of embodiments 1, 3, 4, 6 and 7 was achieved.

(Embodiment 13)

In embodiment 13, although the well layers and the barrier layers included in the emission layer shown in embodiments 1, 3, 4, 6 and 7 were changed to four-cycle $GaN_{0.98}As_{0.02}$ well layers (4 nm thick)/$Al_{0.01}Ga_{0.99}N_{0.99}As_{0.01}$ barrier layers (10 nm thick), an effect similar to that of each of embodiments 1, 3, 4, 6 and 7 was achieved.

(Embodiment 14)

In embodiment 14, although the well layers and the barrier layers included in the emission layer shown in embodiments 1, 3, 4, 6 and 7 were changed to three-cycle $GaN_{0.97}P_{0.03}$ well layers (18 nm thick)/$Al_{0.01}Ga_{0.99}N_{0.98}P_{0.02}$ barrier layers (20 nm thick), an effect similar to that of each of embodiments 1, 3, 4, 6 and 7 was achieved.

(Embodiment 15)

In embodiment 15, although the well layers and the barrier layers included in the emission layer shown in embodiments 1, 3, 4, 6 and 7 were changed to three-cycle $GaN_{0.97}P_{0.03}$ well layers (5 nm thick)/$Al_{0.1}Ga_{0.9}N_{0.94}P_{0.06}$ barrier layers (5 nm thick), an effect similar to that of each of embodiments 1, 3, 4, 6 and 7 was achieved.

(Embodiment 16)

In embodiment 16, although the well layers and the barrier layers included in the emission layer shown in embodiments 1, 3, 4, 6 and 7 were replaced by three-cycle $In_{0.05}Ga_{0.95}N_{0.98}P_{0.02}$ well layers (4 nm thick)/$Al_{0.01}In_{0.06}Ga_{0.93}N$ barrier layers (8 nm), an effect similar to that of each of embodiments 1, 3, 4, 6 and 7 was achieved.

(Embodiment 17)

In embodiment 17, although the well layers and the barrier layers included in the emission layer shown in embodiments 1, 3, 4, 6 and 7 were replaced by five-cycle $In_{0.1}Ga_{0.9}N_{0.94}As_{0.06}$ well layers (2 nm)/$Al_{0.01}In_{0.06}Ga_{0.93}N$ barrier layers (4 nm), an effect similar to that of each of embodiments 1, 3, 4, 6 and 7 was achieved.

(Embodiment 18)

In embodiment 18, although the well layer and the barrier layer included in the emission layer in embodiments 1, 3, 4, 6 and 7 were replaced by five-cycle $Al_{0.01}In_{0.1}Ga_{0.89}N_{0.94}As_{0.06}$ well-layers (2 nm)/$Al_{0.01}In_{0.06}Ga_{0.93}N$ barrier layers (4 nm), an effect similar to that of each of embodiments 1, 3, 4, 6 and 7 was achieved.

(Embodiment 19)

In embodiment 19, although the well layers and the barrier layers included in the emission layer shown in embodiments 1, 3, 4, 6 and 7 were replaced by three-cycle $Al_{0.01}In_{0.05}Ga_{0.94}N_{0.96}P_{0.04}$ well layers (4 nm)/$Al_{0.01}In_{0.06}Ga_{0.93}N$ barrier layers (8 nm), an effect similar to that of each of embodiments 1, 3, 4, 6 and 7 was achieved.

(Embodiment 20)

In embodiment 20, an optical apparatus using the nitride semiconductor laser shown in embodiments 1 to 5 was fabricated. In an optical apparatus, for example, using a violet (an emission wavelength of 400–410 nm) nitride semiconductor laser according to the present invention, the laser excitation threshold current density is low as compared with the conventional nitride semiconductor laser, spontaneous emission light in the laser light is reduced, and noise light is also reduced. Furthermore, such a laser device can stably operate at a high power (50 mW) in a high temperature atmosphere, so that it is suitable for a recording and reproducing optical apparatus used for a high density recording and reproducing optical disk.

Figure 9:
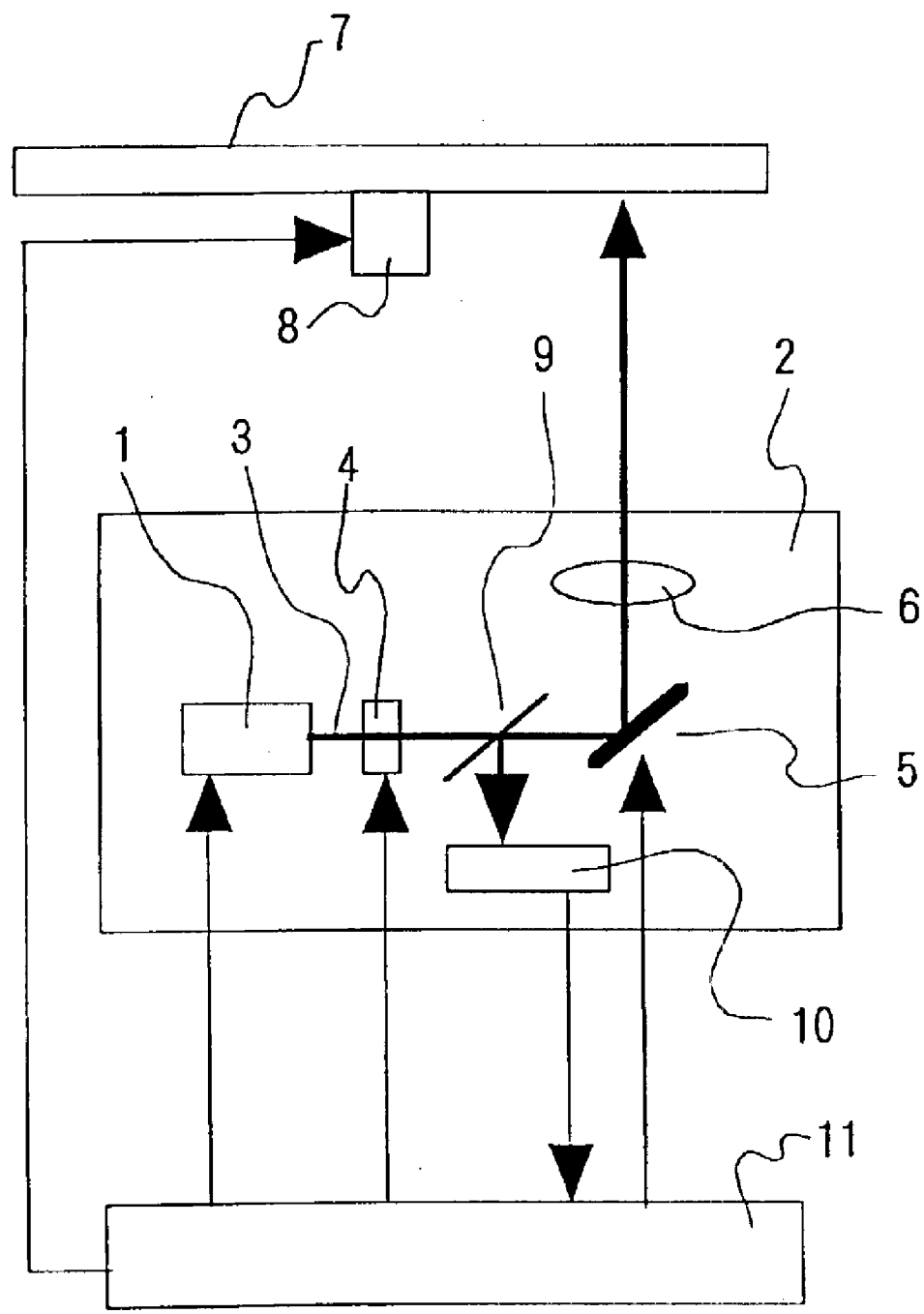
FIG. 9 is a schematic block diagram showing an optical disk recording/reproducing apparatus as an exemplary optical apparatus using the light emitting device according to the present invention.

In FIG. 9, an optical disk information recording and reproducing apparatus including an optical pickup device 2 is shown in a schematic block diagram as an exemplary optical apparatus including a laser device 1 according to the present invention. In this optical information recording and reproducing apparatus, laser light 3 is modulated in response to input information by an optical modulator 4 and the information is recorded on a disk 7 through a scan mirror 5 and a lens 6. Disk 7 is rotated by a motor 8. In reproduction, reflected laser light optically modulated by pit arrangement on disk 7 is detected by a detector 10 through a beam splitter 9, thereby producing a reproduction signal. Operation in each of these components is controlled by a control circuit 11. The output of laser device 1 is normally 30 mW in recording and about 5 mW in reproduction.

The laser device according to the present invention may be used not only in the optical disk recording and reproducing apparatus as described above but also in a laser printer, a projector using a laser diode of three primary colors (blue, green and red), and the like.

(Embodiment 21)

In embodiment 21, the nitride semiconductor light emitting diode according to embodiments 6 and 7 were used in an optical apparatus. A white light source including light emitting diodes or super-luminescent diodes of three primary colors (red, green and blue) using the emission layer according to the present invention could be fabricated and a display using these three primary colors could also be fabricated.

Backlight with lower power consumption and high luminous intensity for use in a crystal liquid display can be obtained by using such a white light source including the light emitting devices according to the present invention in place of a conventional halogen light source. More specifically, the white light source including the light emitting devices according to the present invention can be used as backlight for a liquid crystal display of man-machine interface for a mobile notebook-sized personal computer, a mobile phone and the like and can provide a liquid crystal display having a reduced size and sharp picture quality.

Incidentally, it is noted that the $XN_{1-x-y-z}As_xP_ySb_z$ well layer in the present invention has to satisfy the conditions of $x \leq 0.15$, $y \leq 0.2$ and $z \leq 0.05$. This is because crystallinity of the well layer is deteriorated unless these conditions are not satisfied.

INDUSTRIAL APPLICABILITY

As described above, according to the present invention, in a nitride semiconductor light emitting device including an emission layer having a multiple quantum well structure where a plurality of quantum well layers and a plurality of barrier layers are alternately stacked, the quantum well layer is formed of $XN_{1-x-y-z}As_xP_ySb_z$ ($0 \leq x \leq 0.15$, $0 \leq y \leq 0.2$, $0 \leq z \leq 0.05$, $x+y+z>0$) and Al is contained in the barrier layer, whereby crystal phase separation in the well layer can be suppressed and a luminous efficiency of the light emitting device can be improved. It is noted that X represents one or more kinds of group III elements.

What is claimed is:

1. A nitride semiconductor light emitting device comprising an emission layer having a multiple quantum well structure where a plurality of quantum well layers and a plurality of barrier layers are alternately stacked, wherein said quantum well layer is formed of $CaN_{1-x-y-z}As_xP_ySb_z$ or $XN_{1-x-y-z}As_xP_ySb_z$ ($0 \leq x \leq 0.15$, $0 \leq y \leq 0.2$, $0 \leq z \leq 0.05$, $x+y+z>0$), where X represents a combination of Ga and In, and said barrier layer is formed of an AlGaN layer having an Al concentration of at least $5 \times 10^{18}/cm^3$ and having a thickness of at least 1 nm and at most 20 nm.

2. The nitride semiconductor light emitting device according to claim 1, wherein said barrier layer further contains In.

3. The nitride semiconductor light emitting device according to claim 1, wherein said barrier layer further contains any element selected from the group consisting of As, P and Sb.

4. The nitride semiconductor light emitting device according to claim 1, further comprising a substrate for growing a plurality of semiconductor layers included in said nitride semiconductor light emitting device, wherein in a first adjacent semiconductor layer in contact with a first main surface of said emission layer closer to said substrate and a second adjacent semiconductor layer in contact with a second main surface of said emission layer farther from said substrate, at least said second adjacent semiconductor layer is formed of nitride semiconductor containing at least Al.

5. The nitride semiconductor light emitting device according to claim 4, wherein one of said well layers is directly in contact with said first adjacent semiconductor layer or said second adjacent semiconductor layer.

6. The nitride semiconductor light emitting device according to claim 3, wherein in group V elements in said barrier layer, As content is at most 7.5%, P content is at most 10% and Sb content is at most 2.5%.

7. The nitride semiconductor light emitting device according to claim 1, wherein said emission layer includes at least two and at most ten of said well layers.

8. The nitride semiconductor light emitting device according to claim 1, wherein
said well layer has a thickness of at least 0.4 nm and at most 20 nm.

9. The nitride semiconductor light emitting device according to claim 1, wherein
at least one kind of dopant selected from the group consisting of Si, O, S, C, Ge, Zn, Cd, and Mg is added to at least either said well layers or said barrier layers.

10. The nitride semiconductor light emitting device according to claim 9, wherein
an added amount of said dopant is within a range of $1 \times 10^{16}$ to $1 \times 10^{20}$/cm$^3$.

11. The nitride semiconductor light emitting device according to claim 1, wherein
said light emitting device is formed using a GaN substrate.

12. An optical apparatus comprising said nitride semiconductor light emitting device according to claim 1.

13. The nitride semiconductor light emitting device according to claim 1, further comprising a striped mask formed on a substrate, said mask suppressing growth of nitride semiconductor crystal thereon, and a nitride semiconductor stacked layer structure crystal-grown to cover said substrate and said mask, wherein
said nitride semiconductor stacked layer structure includes said emission layer and has a ridge stripe structure for limiting an injection current path and said ridge stripe structure is formed above a region excluding a middle portion of said striped mask.

14. The nitride semiconductor light emitting device according to claim 1, wherein
on said emission layer, a p-type blocking layer containing Al, a p-type guide layer, and a p-type AlGaN cladding layer are stacked in this order.

15. A method of manufacturing a nitride semiconductor light emitting device of claim 1, wherein
a growth interruption interval within a range from 1 to 180 seconds is provided between crystal growth of said well layer and crystal growth of said barrier layer over a substrate.

16. A method of manufacturing a nitride semiconductor light emitting device comprising an emission layer having a multiple quantum well structure where a plural of quantum well layers and a plurality of barrier layers are alternately stacked, wherein said quantum well layer is formed of $GaN_{1-x-y-z}As_xP_ySb_z$ or $XGaN_{1-x-y-z}As_xP_ySb_z$ ($0 \leq x \leq 0.15$, $0 \leq y \leq 0.2$, $0 \leq z \leq 0.05$, x+y+z>0), where X represents at least one kind of group III elements, and said barrier layer is formed of an AlGaN layer having an Al concentration of at least $5 \times 10^{18}$/cm$^3$ and having a thickness of at least 1 nm and at most 20 nm, the method comprising:
after crystal-growing said emission layer on a substrate and further crystal-growing p-type layers thereon, substrate temperature is decreased to a temperature within a range from 650° C. to 900° C. with supply of ambient gas containing nitrogen and NH$_3$, followed by terminating supply of NH$_3$ and holding the substrate temperature within that range for a prescribed time period.

* * * * *